United States Patent
Huang et al.

(10) Patent No.: US 11,947,254 B2
(45) Date of Patent: *Apr. 2, 2024

(54) METHOD OF MASK DATA SYNTHESIS AND MASK MAKING

(71) Applicant: TAIWAN SEMICONDUCTOR MANUFACTURING COMPANY, LTD., Hsinchu (TW)

(72) Inventors: Hsu-Ting Huang, Hsinchu (TW); Shih-Hsiang Lo, Hsinchu (TW); Ru-Gun Liu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,719

(22) Filed: Aug. 1, 2022

(65) Prior Publication Data

US 2022/0373878 A1    Nov. 24, 2022

Related U.S. Application Data

(63) Continuation of application No. 17/195,469, filed on Mar. 8, 2021, now Pat. No. 11,415,890, which is a continuation of application No. 16/144,882, filed on Sep. 27, 2018, now Pat. No. 10,942,443.

(60) Provisional application No. 62/586,697, filed on Nov. 15, 2017.

(51) Int. Cl.
  *G03F 1/36* (2012.01)
  *G03F 7/20* (2006.01)
  *G03F 1/78* (2012.01)

(52) U.S. Cl.
  CPC ............ *G03F 1/36* (2013.01); *G03F 7/2061* (2013.01); *G03F 1/78* (2013.01)

(58) Field of Classification Search
  CPC ............ G03F 1/36; G03F 1/78; G03F 7/2061
  USPC .......................................................... 430/5
  See application file for complete search history.

(56) References Cited

U.S. PATENT DOCUMENTS

| | | | |
|---|---|---|---|
| 7,383,530 B2 | 6/2008 | Wang et al. | |
| 8,236,464 B1 | 8/2012 | Shih | |
| 8,631,360 B2 | 1/2014 | Wang et al. | |
| 8,719,739 B2 | 5/2014 | Fujimura et al. | |
| 8,739,080 B1 | 5/2014 | Tsai et al. | |
| 8,745,550 B2 | 6/2014 | Cheng et al. | |
| 8,972,908 B2 | 3/2015 | Chen et al. | |
| 9,367,655 B2 | 6/2016 | Shih et al. | |
| 9,390,217 B2 | 7/2016 | Wang et al. | |
| 9,400,857 B2 | 7/2016 | Fujimura et al. | |
| 9,679,100 B2 | 6/2017 | Cheng et al. | |
| 10,460,071 B2 | 10/2019 | Fujimura et al. | |
| 10,942,443 B2 * | 3/2021 | Huang | G03F 1/36 |
| 11,415,890 B2 * | 8/2022 | Huang | G03F 7/2061 |
| 2011/0283244 A1 | 11/2011 | Abdo et al. | |
| 2014/0114634 A1 | 4/2014 | Song et al. | |
| 2014/0220786 A1 | 8/2014 | Lukanc et al. | |
| 2015/0113486 A1 | 4/2015 | Wang | |

OTHER PUBLICATIONS

Notice of Allowance issued in related U.S. Appl. No. 16/144,882, dated Nov. 4, 2020.
Notice of Allowance issued in related U.S. Appl. No. 17/195,469, dated Apr. 13, 2022.

* cited by examiner

*Primary Examiner* — Christopher G Young
(74) *Attorney, Agent, or Firm* — STUDEBAKER & BRACKETT PC (57) ABSTRACT

A method for mask data synthesis and mask making includes calibrating an optical proximity correction (OPC) model by adjusting a plurality of parameters including a first parameter and a second parameter, wherein the first parameter indicates a long-range effect caused by an electron-beam lithography tool for making a mask used to manufacture a structure, and the second parameter indicates a geometric feature of a structure or a manufacturing process to make the structure, generating a device layout, calculating a first grid pattern density map of the device layout, generating a long-range correction map, at least based on the calibrated OPC model and the first grid pattern density map of the device layout, and performing an OPC to generate a corrected mask layout, at least based on the generated long-range correction map and the calibrated OPC model.

20 Claims, 7 Drawing Sheets

METHOD OF MASK DATA SYNTHESIS AND MASK MAKING

CROSS REFERENCE TO RELATED APPLICATION

This application is a Continuation of U.S. patent application Ser. No. 17/195,469 filed on Mar. 8, 2021, which is a Continuation of U.S. patent application Ser. No. 16/144,882 filed on Sep. 27, 2018, now U.S. Pat. No. 10,942,443, which claims priority to U.S. Provisional Application 62/586,697 filed on Nov. 15, 2017, the entire disclosure of the three applications are incorporated herein by reference.

BACKGROUND

The integrated circuit (IC) design is more challenging when semiconductor technologies are continually progressing to smaller feature sizes. The performance of a designed circuit is seriously influenced by the imaging of various circuit patterns during manufacturing including processes for making masks. Thus, masks and final wafer result should be calibrated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently.

Terms like "simulate," "optimize," "adjust," "creating," "manufacture," "fabricate," "make," "form," "compare," "generate," "choose," "determine," "calculate," "measure," are used to describe operations of the disclosed methods, apparatus, or system. These terms are high-level abstractions of the actual operations that are performed, for example, by one or more computers connected to or disconnected from a network and having a user interface to receive user/designer's inputs and/or commands and a data communication interface or a network interface so as to exchange data with semiconductor manufacturing tools including, but not limited to, a lithography tool and an e-beam writer, and semiconductor testing (or characterization, measurement, or metrology) tools including, but not limited to, a scanning electron microscope. The actual operations that correspond to these terms can vary depending on the particular implementation and are readily discernible by one of ordinary skill in the art.

Some or all of the disclosed techniques/operations/steps can be implemented in whole or in part by software comprising computer-executable instructions stored on a computer-readable medium. Such software can comprise, for example, an appropriate electronic design automation ("EDA") software tool. Such software can be executed on one or more computers or computer systems. For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware such as processors, transitory and non-transitory memory devices, and various circuits.

Because of the complexity of some electronic design automation processes and the large size of many circuit designs, various electronic design automation tools are configured to operate on a computing system capable of simultaneously running multiple processing threads or multiple processors. The components and operation of a computer network having a host or master computer and one or more remote or servant computers.

Any data produced from any of the disclosed methods (e.g., intermediate or final test patterns, test patterns values, parameters, or control data) can be stored on a computer-readable storage medium (e.g., tangible computer-readable medium, such as one or more CDs, volatile memory components (such as DRAM or SRAM), or nonvolatile memory components (such as hard drives)), transitory or non-transitory, using a variety of different data structures or formats. Such data can be created, updated, or stored using a local computer or over a network (e.g., by a server computer), and can be exchanged among the computers, the semiconductor manufacturing tools, and the semiconductor testing tools.

In some embodiments, a photomask refers to a patterned substrate used in a lithography process to pattern a photoresist coated on a semiconductor wafer. In the following description, photomask, mask and reticle are used exchangeably. Although only one photomask is to be described in some embodiments, one of ordinary skill in the art should understand that more photomasks can be manufactured in accordance with design principle of this disclosure so that various layers can be made with the photomasks to construct an integrated circuit.

In some embodiments, mask layout, mask data, or electron beam shot map refers to a type of electronic file or data, which is readable by a semiconductor manufacturing tool or a semiconductor testing tool to allow the semiconductor manufacturing tool or the semiconductor testing tool to obtain information contained in the electronic file or data. The information includes, but not limited to, locations in a mask to be manufactured and properties of such locations (i.e., whether to allow portions of a photoresist layer to be remained or removed after being exposed with the manufactured mask based on such electronic file or data, followed by a developing process).

In some embodiments, a semiconductor manufacturing tool or a semiconductor testing tool refers to a tool including, but not limited to, one of motor, optical components such as a light source or lens, an image capturing device, and a computer including a processor, a user interface, transitory and/or non-transitory computer-readable storage medium, and software, program, or instructions stored on the non-transitory computer-readable medium, when executed, causing the processor of the computer to generate commands to control operations of hardware or software modules of the semiconductor manufacturing tool or the semiconductor testing tool.

Figure 1:
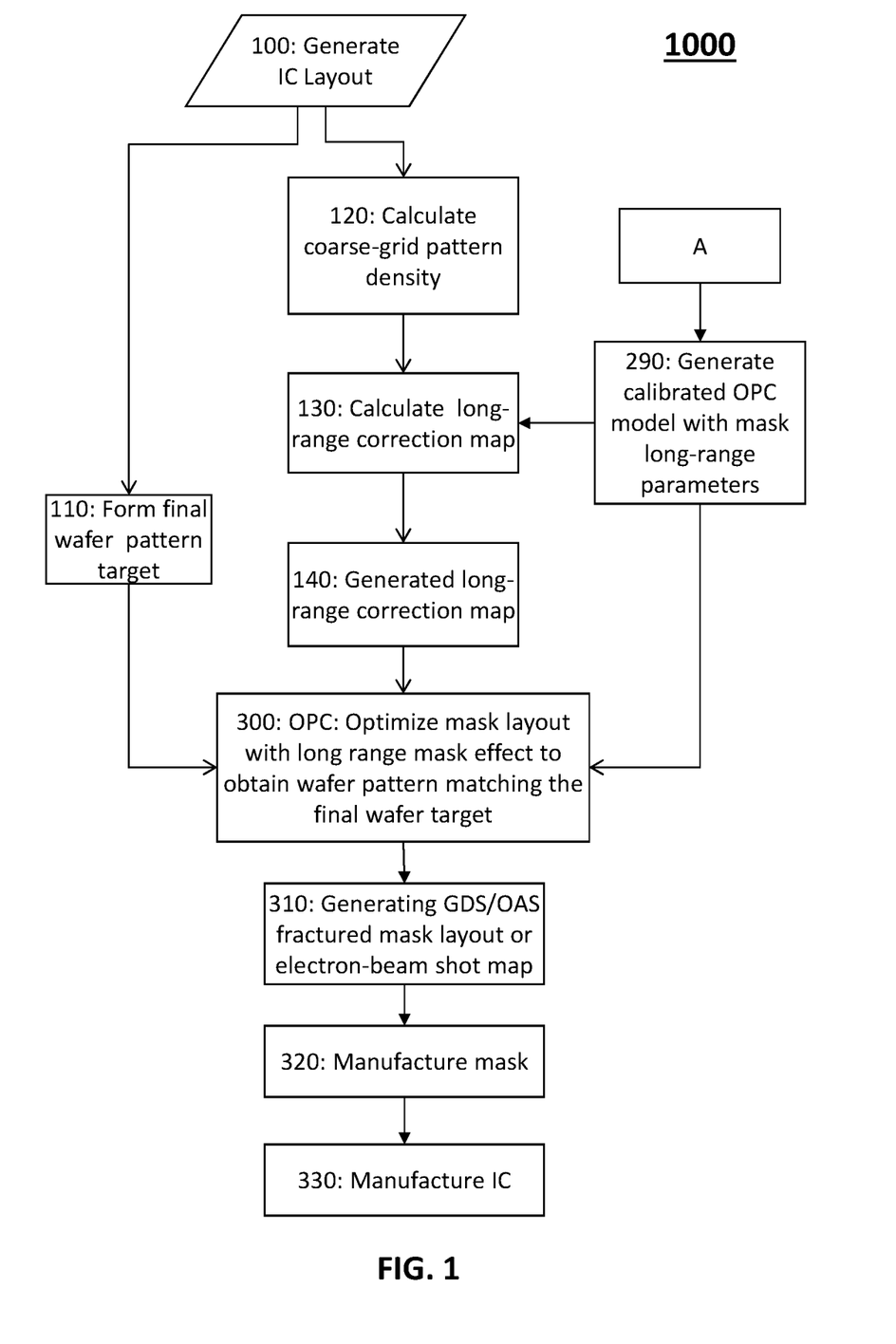
FIGS. 1 and 2 illustrate a flowchart of a method for making an integrated circuit (IC), constructed in accordance with some embodiments.
Figure 2:
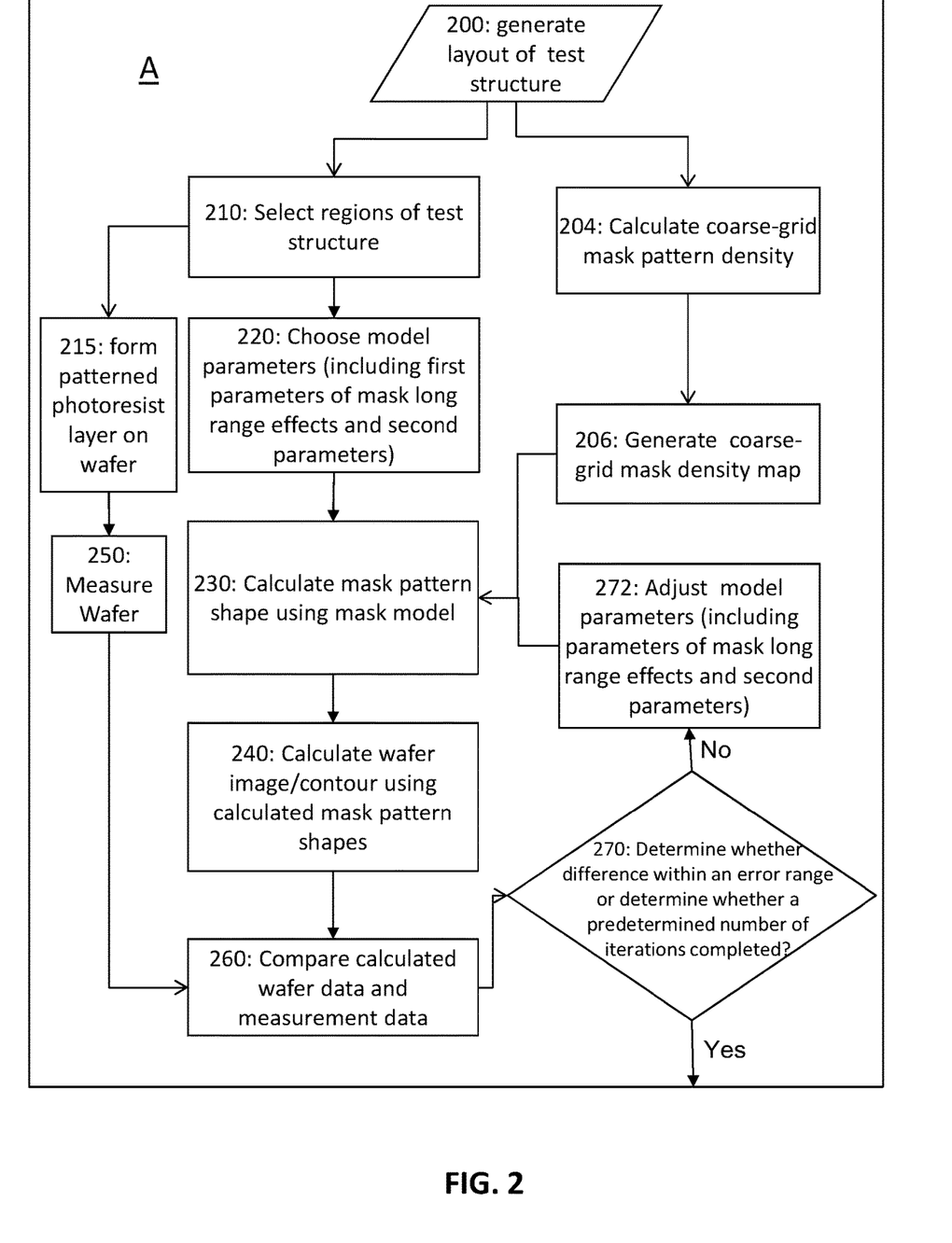

FIGS. 1 and 2 illustrate a flowchart of a method for making an integrated circuit (IC), constructed in accordance with some embodiments.

As shown in FIG. 1, a method 1000 for making an IC includes an operation 100 to generate a layout of an IC having a data format such as, but not limited to, a graphic data system (GDS or GDSII) and an open artwork system interchange standard (OASIS or OAS) proposed by Semiconductor Equipment and Materials International (SEMI), by one or more computer implemented with electronic design automation (EDA) software/tool.

According to some embodiments, the IC design layout includes one or more layers of circuit patterns designed for an IC product, based on the specification of the IC product.

The layout can be designed by a designer. In one example, the designer can be a design house. In another example, the designer is a design team separated from a semiconductor manufacturer that is capable of making IC products according to the IC design layout. In various embodiments, the semiconductor manufacturer is capable of making photomasks, IC products, or both. The designer, based on the specification of the product to be manufactured, implements a proper design procedure to generate the IC design layout. The design procedure can include logic design, physical design, and/or place and route. As an example, a portion of the IC design layout includes various IC features (also referred to as main features), such as active region, doped wells, source and drain, gate electrode, vias/contacts and metal lines of the interlayer interconnection, and openings for bonding pads, to be formed in a semiconductor substrate (such as a silicon wafer) and various material layers disposed over the semiconductor substrate. The IC design layout can include certain assist features, such as those features for imaging effect, process or product testing and/or calibration, and/or mask identification information.

In a case in which the operation 100 to generate a layout of an IC is performed by a design house other than the semiconductor manufacturer who performs the remaining operations of the method 1000, the method 1000 can be modified to include another operation, such as, receiving, by the semiconductor manufacturer, electronic data of the generated IC layout delivered from the design house after the operation 100, according to other embodiments. The electronic data of the generated IC layout can be transmitted through internet or delivered by a portable data storage, or combination thereof. The semiconductor manufacturer can use the received electronic data of the generated IC layout to perform the remaining operations of the method 1000.

The method 1000 includes an operation 110 by forming a final wafer pattern target based on the IC design layout generated in the operation 100. In some embodiments, the operation 110 includes adding dummy features to the IC design layout generated in the operation 100 in order to optimize the semiconductor fabrication. For example, the IC design layout includes a pattern that defines various active regions to be formed on a semiconductor wafer. In another example, the active regions are formed on the semiconductor wafer by a procedure that includes lithography patterning to form an etch mask, etching to form trenches in the semiconductor wafer, filling a dielectric material in the trenches, and performing a chemical mechanical polishing (CMP) process to form shallow trench isolation (STI) features on the semiconductor wafer, thereby defining active regions surrounded by the STI features. The CMP process removes the excessive dielectric material and planarizes the top surface of the semiconductor wafer. However, the CMP process may also introduce dishing and erosion effects. The dummy features are added to the IC design layout to tune the pattern density, thereby reducing the side effects of the CMP process and improve the result of the CMP process. In another example, the IC design layout includes a pattern that defines active regions. The dummy features are inserted to the IC design layout such that a thermal annealing process (such as a thermal annealing process to activate the ion implanted dopant) applied to the semiconductor wafer is improved and the thermal annealing variation from location to location is reduced or eliminated. In another example, the IC design layout is a pattern that defines metal lines in the interconnection structure. The dummy features are added to the IC design layout in the die-corner-circuit-forbidden region for chip corner stress relief. In some other examples, the operation 110 can additionally or alternatively include adding other features, such as mask identification number (such as a barcode), alignment mark, and/or test pattern to the IC design layout. The output of the operation 110 is the final wafer pattern target. In some embodiments, the operation 110 can be omitted, and in this case, the IC design layout output from the operation 100 can be used in a subsequent operation in the method 1000.

As to be described later with reference to operations 320, the mask is made by a mask making process, performed by a photomask manufacturing tool such as an electron-beam writer using mask data (e.g., a fractured mask layout). However, due to various fabrication factors of the mask making process, the real mask pattern formed on the photomask is different from the mask layout.

Some e-beam proximity effects (or "e-beam effects") can be characterized by, for example, Gaussian or Gaussian-like functions, while the differences in effective ranges can be represented by the different standard deviations of the respective Gaussian terms. In some embodiments, the e-beam effects are separated into two groups: short-range effects and long-range effects. In the first group, short-range effects can include, but are not limited to, beam blurring and forward scattering. In the second group, long-range effects can include, but are not limited to, backscattering, resist develop loading effect, and fogging. As an example, backscattering can have a range of about 15 μm with a standard deviation of 5 μm. One of ordinary skill in the art should understand that the range and the standard deviation of backscattering can be different from the example, dependent on characteristics of the e-beam such as a size, energy, and current of the focused e-beam and materials used to make the mask.

Elimination or reduction of the long-range effects, due to their large effective ranges, can be extremely time-consuming during mask pattern synthesis if the long-range effects are to be calculated iteratively, especially if the long-range effects are calculated in mask proximate correction (MPC) which is performed after optical proximity correction (OPC). In a case in which the MPC could not obtain a result within an acceptable error range or could not converge properly during computation, the MPC and some or all the modeling process prior to the MPC have to be redone, which is time consuming, thereby causing a long turnaround time.

On the other hand, the long-range effects are essentially unchanged during small geometric changes made during typical edge-based corrections. In some embodiment, the long-range effects can be pre-computed from a pre-correction layout and the result is stored in a long-range correction map. Various embodiments of the present disclosure provide a technique for modeling e-beam effects including e-beam long-rang effects in an e-beam lithography model. In some embodiments, test patterns can be used to calibrate e-beam model parameters including e-beam long-rang effects. Thus, in some embodiments, a mask layout to compensate for e-beam long-rang effects during e-beam lithography can be achieved. In some embodiments, e-beam long-range effects, such as backscattering and fogging that may occur in the making of the mask and that may further affect photoresist pattern during IC manufacturing, can be computed and corrected. In some embodiments, the long-range effects on the photoresist are computed from the pre-correction layout and the result is stored in a long-range correction map. These features will be more apparent in the following descriptions.

Referring to FIG. 2 which shows operations of the method 1000 represented by "A" in FIG. 1, the method 1000 for making an IC includes an operation 200 to generate a layout of test structures having the same data format as the IC layout generated in the operation 100, by the computer or the computer system implemented with electronic design automation (EDA) software/tool.

According to some embodiments, the test structure layout includes one or more layers of test structures designed for determining or optimizing parameters/compensation data used in the processes to manufacture the IC. The test structures are configured to have various shapes with a wide range in size to cover the structures in the IC, such that the manufacturing process of the IC can be mimicked and modified/improved through the manufacturing processes of the test structure. In some embodiments, the layout of the test structures can be used not only to calibrate a lithography process model but also to calibrate an e-beam model which includes a long-range component.

Referring to FIG. 2, the method 1000 includes an operation 210 to select regions of the test structures for calibration using the electronic design automation (EDA) software/tool.

The making of the mask patterns of the selected test structure in the operation 210 can be performed by an e-beam lithography tool, which is also to be used to make the mask of the IC.

In some embodiments, processing parameters (i.e., beam current or energy, beam size, relative speed with respect to the substrate used to forming the mask, etc.) set forth in the e-beam lithography tool to make the mask patterns of the selected test structures in the operation 210 can be the same as those used to make the mask of the IC. In other embodiments, the processing parameters set forth in the e-beam lithophany tool to make the mask patterns of the selected test structures can be modified according to design particulars, and the modified processing parameters can be stored in the e-beam lithography tool to be used later to manufacture the IC mask.

In some embodiments, process models can be used to model semiconductor manufacturing processes. A process model can be used in a number of applications during the design of a semiconductor chip. For example, process models are commonly used for making corrections to layouts to compensate for undesirable effects of semiconductor manufacturing processes. Here, according to some embodiments, in an operation 220, parameters that can be used to model the manufacturing process can be selected and determined, for example, based on default setting stored in the computer of the computer system in accordance with prior IC/test structure designs, or can be selected and determined by a user input via a user interface of the computer of the computer system. In a case in which the parameters that can be used to model the manufacturing process are selected and determined based on the user input, the computer or the computer system configured to execute the modeling operations can output a user interface to allow a user to input, via a keyword, a mouse, a touch input, etc., to select and determine the parameters to be used in modeling the manufacturing process, in the operation 220.

In some embodiments, the parameters used in the operation 220 include two or more types. A first type of the parameters includes first parameters of long-range effects including, but not limited to, an effective range of the long-range effects, a standard deviation of the long-range effects, and an associated weight index of the long-range effects (here, the weight index indicates a relative factor used to multiply to the Gaussian function representing the long-range effects, with respect to other effects such as a short-range effect).

The second type of the parameters includes second parameters indicative of a geometric feature of a structure or a manufacturing process to make the structure, according to some embodiments. Examples of the second parameters indicative of the geometric feature of the structure and manufacturing process of the structure will be explained later.

The first parameters can be selected and determined in the operation 220. For example, in a case in which the backscattering dominates the long-range effect, the range can be set to be 15 μm with a standard deviation of 5 μm having a weight index of 0.8 as the initial settings in the model to simulate the manufacture process. Initial settings of the second parameters can also be selected and determined in the operation 220. One of ordinary skill in the art should understand that such settings of the first and second parameters are merely as an example and the present disclosure should not be limited thereto.

In some embodiments, the initially set values are to be automatically updated during iterations to be described below by the computer of the computer system when executing the EDA software/tool according to some embodiments. In other embodiments, the initially set values are to be manually updated, for example, by generating pop-up windows to allow the user/designer to input the updated values, during the iterations when executing the EDA software/tool.

Then, in an operation 230, mask pattern shapes of the selected test structures can be calculated by using a mask model in which a suitable grid mask density map indicative of the layout of the test structure are applied with the model parameters, including the first parameters of the long-range effects and the second parameters of the geometric feature of the structure and manufacturing process of the structure output, from the operation 220.

Generation of the suitable grid mask density map indicative of the layout of the test structure will be described below with reference to operations 204 and 206 shown in FIG. 2.

In some embodiments, the layout of the test structure can be modeled (or simulated or analyzed) by the computer of the computer system with different mask pattern density grid sizes such as a regular fine grid size, a medium grid size, and a coarse grid size. One of ordinary skill in the art should understand the three different grid sizes are merely an example, few or more sizes with different grid intervals can be chosen by the user input or automatically determined by the computer or the computer system, depending on design particulars, so as to generate the suitable grid mask density map.

In some embodiments, each grid contains information indicative of the location of the gird and property of the grid (the property includes information whether to keep or remove a photoresist material by a photolithography process with the photomask to be manufactured based on the mask data).

Here, the medium grid mask pattern density indicates a medium level of grid volume which is greater than that of the coarse grid mask pattern density and is less than that of the fine grid mask pattern density. Due to different levels of grid volume, time used by the computer or the same computer system to calculate the medium grid density is longer than that used to calculate the coarse grid density and is shorter than that used to calculate the regular fine grid density. In some embodiments, among the available grid density levels provided by the computer or the computer system or by the user, a relatively coarse grid density can be selected, by the user or automatically by the computer or the computer system. In one embodiment, in a case in which the selected one can have the fewest grids, the modeling time used to model the fewest (or coarsest) grid map can be the shortest. In some embodiments, the user can adjust the grid density level for subsequent modeling manually by inputting a suitable grid density level through a user interface provided by the computer or the computer system. In some embodiments, in an operation 204, the grid mask pattern density, such as a coarse-grid mask pattern density, can be selected and calculated. As such, shorter modeling time is used in the subsequent operations, as compared to an example in which only regular fine-grid calculations are used.

Thereafter, in an operation 206, a coarse-grid mask density map indicating the location information and the property information of each grid can be generated by the computer or the computer system, based on the calculated coarse-grid mask pattern density.

Next, in step 240, a wafer image or a wafer contour indicating or predicting a result of a patterned photoresist layer patterned with the mask having the test structure can be generated by the computer or the computer system, at least based on the prior modeling result output from the operation 230.

Still referring to FIG. 2, after the layout of the test structure is generated in the operation 200, a structure, for example, a patterned photoresist layer can be formed on a substrate such as a wafer by transferring the mask patterns of the test structures to a photoresist layer through a photolithography process in operation 215. The patterned photoresist layer formed in operation 215 can be measured or characterized by a testing or metrology tool, such as a scanning electron microscope (SEM), in an operation 250. Accordingly, an SEM contour or an SEM-measured critical dimension (CD) of the entirety or a selected portion of the patterned photoresist layer or wafer pattern can be obtained in the operation 250 by, for example, the scanning electron microscope (SEM).

After completion of the operation 250 or during the operation 250, the SEM contour or the SEM measured CD having a computer-readable format of the as-measured patterned photoresist layer or wafer pattern obtained in the operation 250 can be transmitted by the scanning electron microscope (SEM) to the computer or the computer system.

Then, in an operation 260, the received SEM contour or SEM CD having a computer-readable format of the as-measured patterned photoresist layer or wafer pattern obtained in the operation 250, and the simulated/calculated contour or simulated/calculated CD of a patterned photoresist layer output from the operation 240, are compared by the computer of the computer system.

In a case in which the comparison in the operation 260 indicates that the received SEM contour or SEM CD and the simulated/calculated contour or simulated/calculated CD match each other or the difference therebetween is in a predetermined error range (Yes in an operation 270), the model parameters set in the operation 220 can be used in the subsequent operations shown in FIG. 1, and the operations "A" are completed.

In contrast, in a case in which the comparison in the operation 260 indicates that the difference between the received SEM contour or SEM CD and the simulated/calculated contour or simulated/calculated contour CD is out of the predetermined error range (No in an operation 270) or indicates that a predetermined number of modeling iterations have not been completed, iteration operations including operations 272, 230, 240, 260, and 270 can be repeated until a new comparison in a subsequent operation 260 in the iteration operations indicates that the received SEM contour or SEM CD and a subsequently simulated/calculated contour or simulated/calculated CD match each other or the difference therebetween is in the predetermined error range (Yes in a subsequent operation 270 in the iteration operations) or until the predetermined number of iteration operations have been completed (Yes in a subsequent operation 270 in the iteration operations).

One of ordinary skill in the art should understand that the predetermined error ranges and/or the predetermined number of iteration operations can be selected by the user through a user interface provided by the computer or be retrievable default values stored in the computer or the computer system in accordance with prior designs.

One of ordinary skill in the art should understand that in the operation 272, the model parameters can be adjusted automatically or manually, for example, by increase or decrease a predetermined amount to the previous used model parameters. In this regard, the initial model parameters set in the operation 220 can be used as a reference to set the model parameters in the operation 272 in the first loop of the iteration operations. The initial model parameters set in the operation 220 are not applied to the operation 230 during the following iteration operations. One of ordinary skill in the art should understand that values of other parameters that are not adjusted in the operation 272 can be maintained, based on the output from the operation 220, in the iteration operations.

As described above, in some embodiments, the model parameters include the first parameters of the long-range effects and the second parameters of the geometric feature of the structure and manufacturing process of the structure. The model parameters are applied to obtain the simulated/calculated contour or CD that matches the SEM contour or CD within the allowable error range or that are used in the final loop of the iteration operations, and can be found through the operations "A" shown in FIG. 2.

During the iterations described with reference to FIG. 2, the first parameters and the second parameters are optimized together. The present disclosure, however, is not limited thereto. In other embodiments, the first parameters and the second parameters can be optimized one after another by executing a first loop to optimize the first parameters (or the second parameters) and a second loop, embedded in the first loop, to optimize the second parameters (or the first parameters).

The iterations described with reference to FIG. 2 can be referred to as optical proximity correction (OPC). An OPC is able to generate a mask pattern such that the generated mask pattern is able to form a wafer pattern on the semiconductor wafer with a tolerable difference from the wafer target. According to some embodiments, an OPC process is to correct both the proximity effects and the long-range effects.

The OPC described with reference to FIG. 2 and the OPC to be described later in an operation 300, and techniques thereof, are not particularly limited to the above example. For example, additional effects/features can be considered and modeled in the OPC.

In some embodiments, the OPC includes moving edges of a main feature and adding assist features to the mask data. In various embodiments, the main feature is resized, repositioned, and/or reshaped. In another embodiment, various assist features, such as scattering bars, are added to the mask data. In still another embodiment, serifs or hammerheads are added to the mask data. The assist features may be placed at a distance away from the main feature (such as scattering bars) or be placed in contact to the main feature (such as serifs and hammerheads).

In some embodiments, the OPC can be implemented in consideration of the environmental impact, such as those features approximate the patterns that are more important than others in the IC. The environmental impact includes etching loading effect, the loading effect of the lithography patterning or the pattern density of a chemical mechanical polishing (CMP) process. Those environmental impacts can be considered during the OPC process by a model convolution. In one example, the environment-induced-corner-rounding critical level can be defined by the model convolution and is incorporated in a model-based OPC process. In some embodiments, the OPC process simulates the wafer masking process that includes the imaging effect of the lithography exposing process, responses of the photoresist layer to the light radiation during the lithography exposing and to the developing solution during the developing process, and/or an etching process to transfer the pattern from the photoresist layer to the underlying material layer of the semiconductor substrate. In some embodiments, during the OPC process, variations to parameters associated with a selected structure(s) and/or nearby structures ("structure parameters"), such as width and/or length of the structure, distance to an adjacent structure, and width or size of an adjacent structure, are adjusted. In some embodiments, the iterations of the OPC process can also include introducing variations to "process parameters," such as illumination type, illumination dose, focus, resist characteristics, reticle characteristics, and etching properties.

In some embodiments, the OPC process is model-based. The OPC model simulates the imaging effect of the lithography exposing process to be applied to the semiconductor wafer. During the model-based OPC process, a main feature is adjusted as described above (adding assist features, resizing, repositioning and/or reshaping), then the modified mask data is simulated by the OPC model, thereby generating a simulated wafer pattern. The simulated wafer pattern is further compared with the wafer target to evaluate if the modified mask data is acceptable. The evaluation is implemented by a proper procedure, such as edge placement error, or area difference. In one particular example, various target points are assigned to the wafer target. In a case in which the simulated wafer contours are within a tolerable distance from the target points, it is considered that the modified mask data is acceptable.

The above described OPC model in the OPC process can be represented by the first parameters and the second parameters to perform the OPC model calibration to the test layout, as described with reference to FIG. 2. Accordingly, the model parameters including the first parameters of the long-range effects and the second parameters of the geometric feature of the structure or the manufacturing process to make the structure are calibrated. Hereinafter, such model parameters including the first parameters of the long-range effects and the second parameters of the geometric feature of the structure or the manufacturing process to make the structure will be referred to be the calibrated model parameters. According to other non-limited embodiments, the model parameters chosen in the operation 220 can include third parameters indicative of short-range effects, and the iterations in "A" can include optimizing the third parameters in a similar manner as the first or second parameters.

The method 1000 in FIG. 1 includes an operation 120, which can be the same or similar to the operation 204, except that the IC layout data rather the layout of the test structure is used.

The method 1000 includes an operation 290 to generate the OPC model with the calibrated model parameters provided by the series of operations "A" shown in FIG. 2. To distinguish the OPC model with the calibrated model parameters from an OPC model without the calibrated model parameters, the OPC model with the calibrated model parameters will be referred to be a calibrated OPC model.

Then, in an operation 130, a long-range correction map can be calculated, in consideration of the calculated coarse-grid pattern density output from the operation 120 and the calibrated OPC model with mask long-range parameters output from the operation 290.

Then, in an operation 140, a long-range correction map (i.e., an electronic file), based on the calculation performed in the operation 130, is generated such that the long-range correction map is stored to be later received and reused. A grid in the long-range correction map can contain information indicative of the calibrated parameters including the parameters of the long-range effects for such a grid.

The method 1000 includes an operation 300 by performing an optical proximity correction (OPC) process, based on the calibrated OPC model with mask long-range parameters output from the operation 290 by using the long-range correction map generated in the operation 140, to the mask layout in order to fit the wafer pattern to the final wafer target formed in operation 110 (or the IC design layout if the operation 110 is omitted). In some embodiments, the OPC performed in the operation 300 corrects the image errors by modifying the IC design layout. In some embodiments, the OPC performed in the operation 300 corrects the long-range effects caused, for example, by backward electron scattering during e-beam writing to manufacture the photomask, because the calibrated OPC model parameters, including the optimized first parameters of the long-range effects and the optimized second parameters of the geometric feature of the structure or the manufacturing process in the operation "A," are used as a basis in the operation 300. As such, the optimized mask layout can be obtained by the OPC in the operation 300.

The method 1000 includes an operation 310, based on the optimized mask layout provided in the operation 300, to generate the mask data, such as fracturing the mask pattern, and/or the corresponding electron-beam shot map. In some embodiments, the operation 310 includes mask data preparation to generate the electron-beam shot map. The mask data preparation includes fracturing the mask pattern into polygons or other suitable shapes, and further includes defining dose for each polygon in some examples.

The method 1000 includes an operation 320 for manufacturing the mask based on the fractured mask layout or the electron-beam shot map. In some embodiments, an e-beam or a mechanism of multiple e-beams is used to form a pattern on the mask based on the electron-beam shot map. The mask can be designed in various suitable technologies. In one embodiment, the mask is designed to have a binary pattern. In this case, the mask pattern includes dark regions and bright regions. The radiation beam (e.g. ultraviolet or UV beam), used to expose the photo-sensitive material layer (such as photoresist) coated on a wafer, is blocked by the dark region and transmits through the bright regions. In one example, the binary mask includes a transparent substrate (e.g., fused quartz), and an opaque material (e.g., chromium) coated in the dark regions of the mask. In another embodiment, the mask is designed to have phase shift and can be referred to as a phase shift mask (PSM), various features in the pattern formed on the mask are configured to have proper phase difference to enhance the resolution and imaging quality. In various examples, the PSM can be an attenuated PSM or an alternating PSM known in the art. In some other embodiments, the mask is an extreme ultraviolet (EUV) mask having a reflective pattern. In one example, the EUV mask includes a substrate with a suitable material, such as a low thermal expansion material (LTEM). In various examples, the LTEM includes fused quartz, TiO$_2$ doped SiO$_2$, or other suitable materials with low thermal expansion. The EUV mask includes a reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The EUV mask may further include a capping layer, such as ruthenium (Ru), disposed on the ML for protection. The EUV mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In some embodiment, the method 1000 further includes an operation 330 for manufacturing the IC with the manufactured mask from the operation 320 to construct one or more layers having patterns transferred from the manufactured mask through a photolithography process and an etching process. In various examples, the pattered material layer includes etched material layer (such as etched semiconductor layer, etched dielectric material layer or etched conductive material layer), or alternatively doped semiconductor layer (such as doped silicon layer). As noted above, the wafer making process includes lithography exposing process, developing process, and etching process (or ion implantation process). Due to various fabrication factors of the wafer making process, such as photoresist blur, mask diffraction, projection imaging resolution, acid diffusion, and/or etching bias, the real wafer pattern formed on the semiconductor wafer is different from the wafer target pattern, which is the final wafer target or IC design layout.

Although not shown in the drawings, a mask proximate correction (MPC) operation can be performed after the OPC in the operation 300 but before the operation 310.

However, according to some embodiments, the MPC operation which may be used to correct the long-range effects in the mask making process can be omitted in the method 1000, since the operations shown in FIGS. 1 and 2 have corrected the long-range effects in the mask making process. Accordingly, by omitting the MPC operation, less computation is used to obtain the electron beam shot map for mask making and turnaround time to synthesize the mask pattern can be shortened, as compared to an example in which the long-range effects are corrected in the MPC rather than in the OPC.

In some embodiments, since the MPC operation is not used in the method 1000, additional errors which may be introduced in the MPC operation can be avoided, thereby improving modeling accuracy.

According to some embodiments, the coarse-grid mask density map is used during model calibration and the coarse-grid correction map is used during the OPC in the method 1000, thereby reducing calculation time as compared to an example in which only regular fine-grid calculations are used.

Figure 3A:
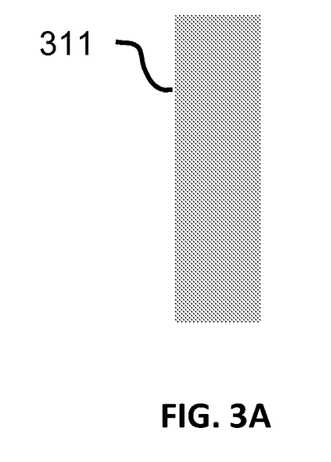
FIGS. 3A and 3B show examples of a layout pattern or a structure formed using the layout pattern in different stages in the method in FIGS. 1 and 2 in accordance with some embodiments.
Figure 3B:
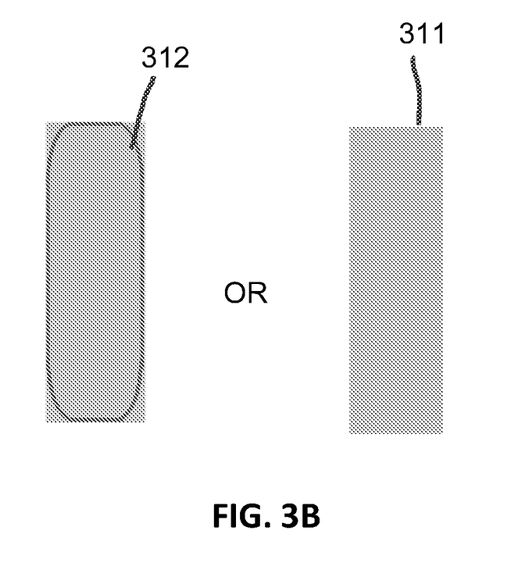

FIGS. 3A and 3B show examples of a layout pattern or a structure formed using the layout pattern in different stages in the method 1000 in FIGS. 1 and 2 in accordance with some embodiments.

FIG. 3A shows a rectangle 311 representing a structure to be manufactured on a substrate. In one embodiment, the rectangle 311 defines a contact hole to be formed on a semiconductor substrate, although the contact hole is not limited to a rectangular shape and can be polygon (or trapezoid) or another suitable shape. In some embodiments, the rectangle 311 can be generated in the operation 100 shown in FIG. 1.

FIG. 3B shows a structure 312 generated in the operation 110, derived from the rectangle 311 generated in the operation 100. Since the corners of the structure 312 is rounded as compared to the rectangle 311, the structure 312 as the final wafer target can allow iterative simulation to be converged more efficiently at the time when the simulated wafer pattern is compared to the wafer target to determine the difference in the operation 300. In some embodiments, the same rectangle 311 can maintain as the final wafer target in the operation 110 shown in FIG. 1.

According to some embodiments, the operations of the method for making an IC are not limited to those shown in FIGS. 1 and 2. Modifications can be made to the method 1000 depending on design particulars. These features will be more apparent with reference FIGS. 4-6 to be described below.

Figure 4:
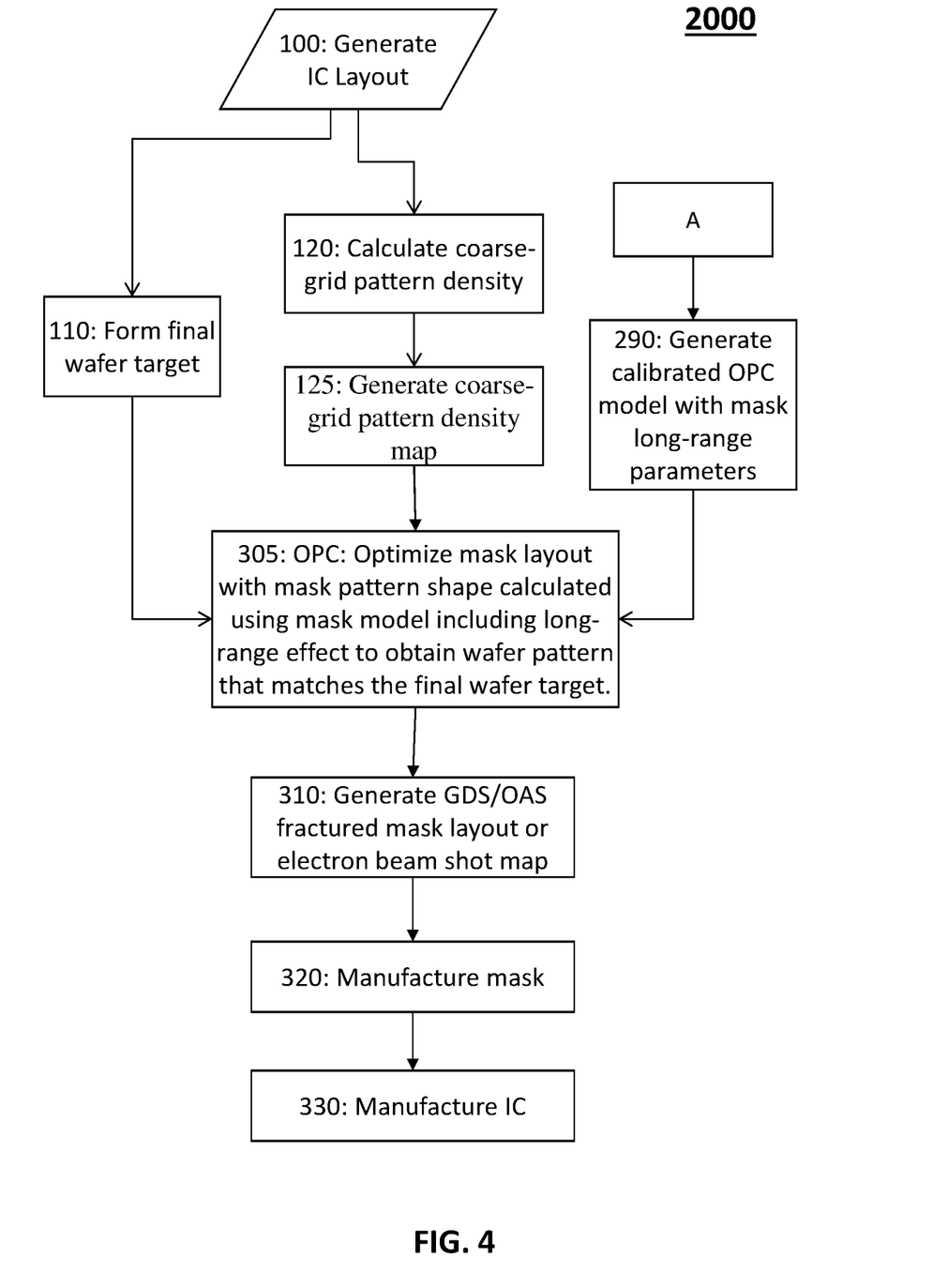
FIG. 4 illustrates a flowchart of another method for making an integrated circuit (IC), constructed in accordance with some embodiments.

FIG. 4 illustrates a flowchart of another method 2000 for making an integrated circuit (IC), particularly IC designing and mask making, constructed in accordance with some embodiments.

The operations represented by "A" in FIG. 4 are the same as those represented by "A" in FIG. 1. To avoid redundancy, the operations in FIG. 4 the same as those described above will be omitted and only the operations shown in FIG. 4 different from the operations shown in FIG. 1 will be described.

In some embodiments, a long-range correction map 140 generated in the method 1000 described with reference to FIG. 1 is not generated in the method 2000 shown in FIG. 4. Instead, referring to FIG. 4, a long-range density map (i.e. a coarse grid density map) is generated in operation 125 and used in an OPC operation 305. In the OPC operation 305, a mask pattern shape is calculated using the mask model including long-range effect and the long-range density map.

Referring to FIG. 4, the grid mask pattern density, such as the coarse-grid mask pattern density, is calculated in the operation 120 by the computer or the computer system.

Then, in the operation 305, based on the final wafer target provided by the operation 110, the calibrated OPC model provided by the series of operations shown in FIG. 2, and based on the coarse-grid mask density map generated in operation 125 indicating the location information and the property information of each grid provided by the operation 120, mask pattern shapes are calculated with consideration of various process effects including the long-range effects, which is repeatedly executed in the OPC iterations.

Similar to the operations shown in FIGS. 1 and 2, in the method 2000, an MPC operation which is used to correct the long-range effects in the mask making process can be omitted, since the operations of the method 2000 shown in FIG. 4 (also see FIG. 2 for the operations represented by "A" in FIG. 4) have corrected the long-range effects in the mask making process. Accordingly, by omitting the MPC operation, less computation is used to obtain the electron beam shot map for mask making and turnaround time to synthesize the mask pattern can be shortened, as compared to an example in which the long-range effects are corrected in the MPC rather than in the OPC.

In some embodiments, since the MPC operation is not used in the method 2000, additional errors which may introduced in the MPC operation can be avoided, thereby improving modeling accuracy.

According to some embodiments, a coarse-grid mask density map generated in an operation 206 by using the coarse-grid mask pattern density calculated in the operation 204, is used during model calibration, and a coarse-grid correction map generated in an operation 125 by using the coarse-grid pattern density calculated in the operation 120, is used during the OPC in the method 2000, thereby reducing calculation time as compared to an example only regular fine-grid calculations are used.

Figure 5:
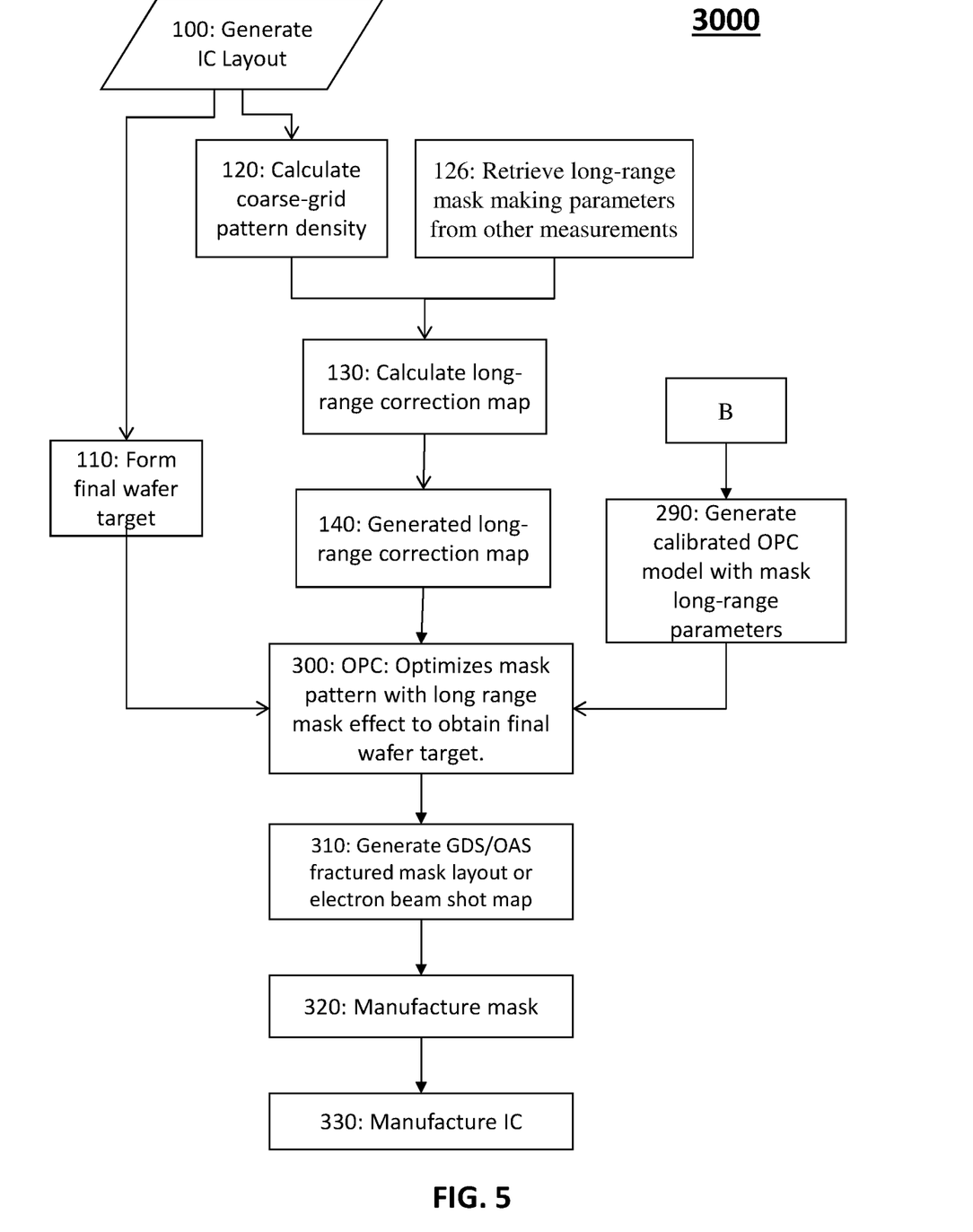
FIGS. 5 and 6 illustrate a flowchart of a yet another method for making an integrated circuit (IC), constructed in accordance with some embodiments.
Figure 6:
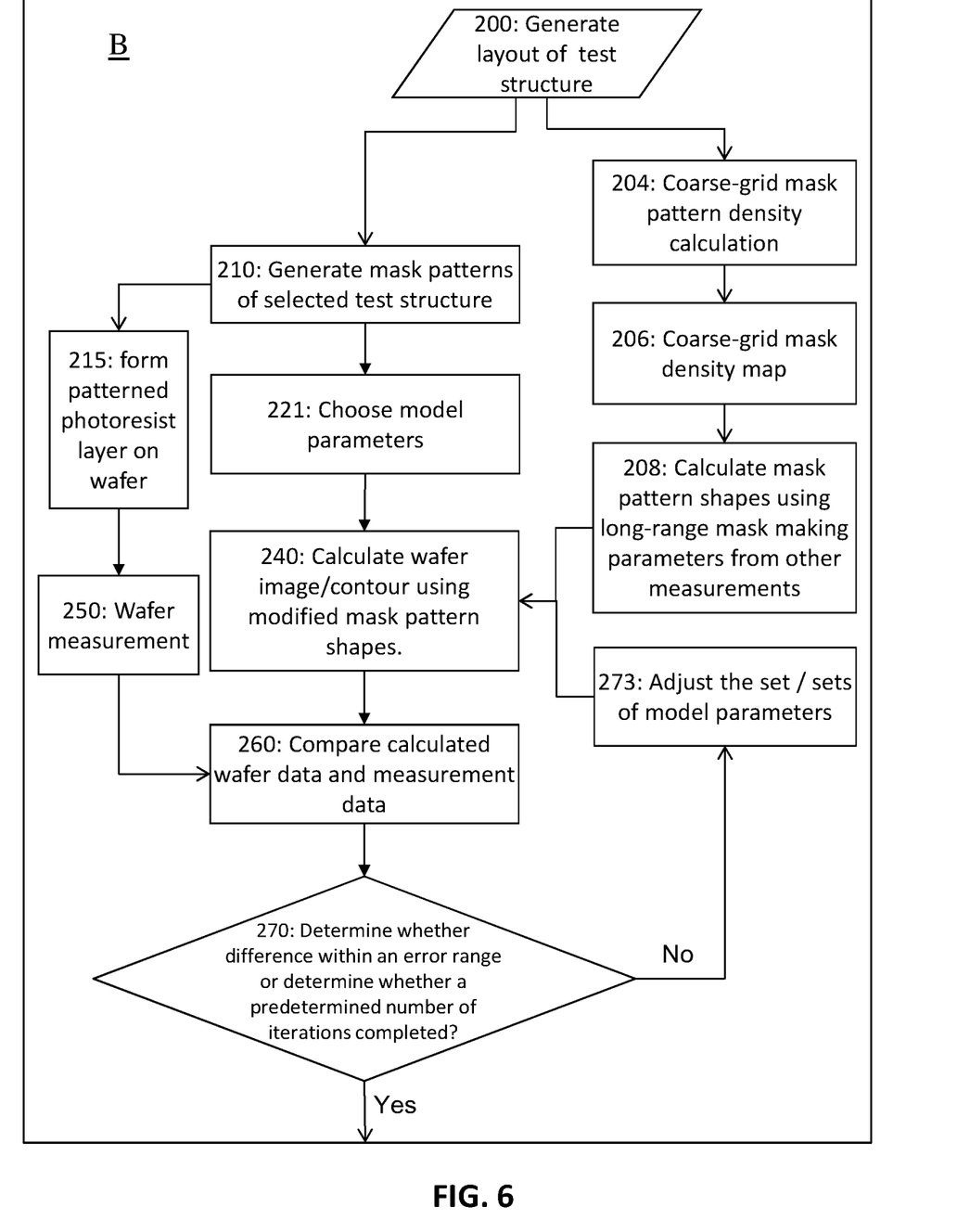

FIGS. 5 and 6 illustrate a flowchart of a yet another method 3000 for making an integrated circuit (IC), constructed in accordance with some embodiments. For convenience of illustration, FIG. 6 shows operations B of the method 3000 prior to the operation 290.

To avoid redundancy, the operations in FIGS. 5 and 6 the same as those described above with reference to FIGS. 1 and 2 will be omitted and only those operations in FIGS. 5 and 6 different from the operations shown in FIGS. 1 and 2 will be described.

In some embodiments, as compared to the method 1000, the method 3000 may omit the operation 220 of the method 1000 shown in FIG. 2, and accordingly, the selection or determination of the parameters of mask long-range effects which is performed in the operation 220 of the method 1000 can be performed differently in the method 3000. For example, the selection or determination of the parameters of mask long-range effects in the method 3000 can be based on prior models used in other designs or measurements and be retrieved by the computer or the computer system from a storage thereof or another tool or server that contain such information in an Operation 126 of the method 3000 shown in FIG. 5 in which the parameters of mask long-range effects can be considered at the time to calculate a long-range correction map.

As compared to the operation 220 shown in FIG. 2, an operation 221 shown in FIG. 6 can be performed to select or determine model parameters. For example, a user interface is provided by the computer or the computer system implemented with EAD software/tool which performs the method 3000 so that the designer is allowed to select or input the model parameters through the user interface. For another example, when the operation 221 is being executed, a file containing the model parameters stored locally or remotely is read by the computer or the computer system implemented with EAD software/tool which performs the method 3000. The selected or determined model parameters do not include the parameters of the long-range effects but include other model parameters such as the above-described second parameters of the geometric feature of the structure or the manufacturing process to make the structure. The parameters of the long-range effects can also be used in an operation 208 following the operation 206.

In the operation 208 shown in FIG. 6, the mask pattern shape can be calculated by using the coarse-grid mask density map generated in the operation 206 and the parameters of the long-range effects from other designs or measurements retrieved by the computer or the computer system from a storage thereof or another tool or server that contains such information.

In some embodiments, since the parameters selected or determined in the operation 221 do not include the parameters of the long-rang effects and the parameters used in the operation 208 including the parameters indicative of the long-rang effects, if iteration operations including a loop including operations 240, 260, 270, and 273 are preformed, the operation 273 is to adjust the other model parameters selected or determined in the operation 221 but not to adjust the parameters of the long-rang effects included in the operation 208, since the parameters indicative of the long-rang effects are considered as constant parameters in the iteration operations.

According to some embodiments, the MPC operation which is used to correct the long-range effects in the mask making process can be omitted in the method 3000, since the operations shown in FIGS. 5 and 6 have corrected the long-range effects in mask making. Accordingly, by omitting the MPC operation, less computation is used to obtain the electron beam shot map for the making mask and turnaround time to synthesize the mask pattern can be shortened, as compared to an example in which the long-range effects are corrected in the MPC rather than in the OPC.

In some embodiments, since the MPC operation is not used in the method 3000, additional errors which may introduced in the MPC operation can be avoided, thereby improving modeling accuracy.

According to some embodiments, the coarse-grid mask density map is used during model calibration and the coarse-grid correction map is used during the OPC in the method 3000, thereby reducing calculation time as compared to an example only fine-grid calculations are used.

As compared to the embodiments described with reference to FIGS. 1, 2 and 4, in the embodiments described with reference to FIGS. 5 and 6, the iteration operations to determine the calibration OPC model with long-range mask effect, if performed, can be performed within a shorter time, since the parameters indicative of the long-rang effects are considered as constant parameters and fewer variables are involved in the iteration operations.

Figure 7:
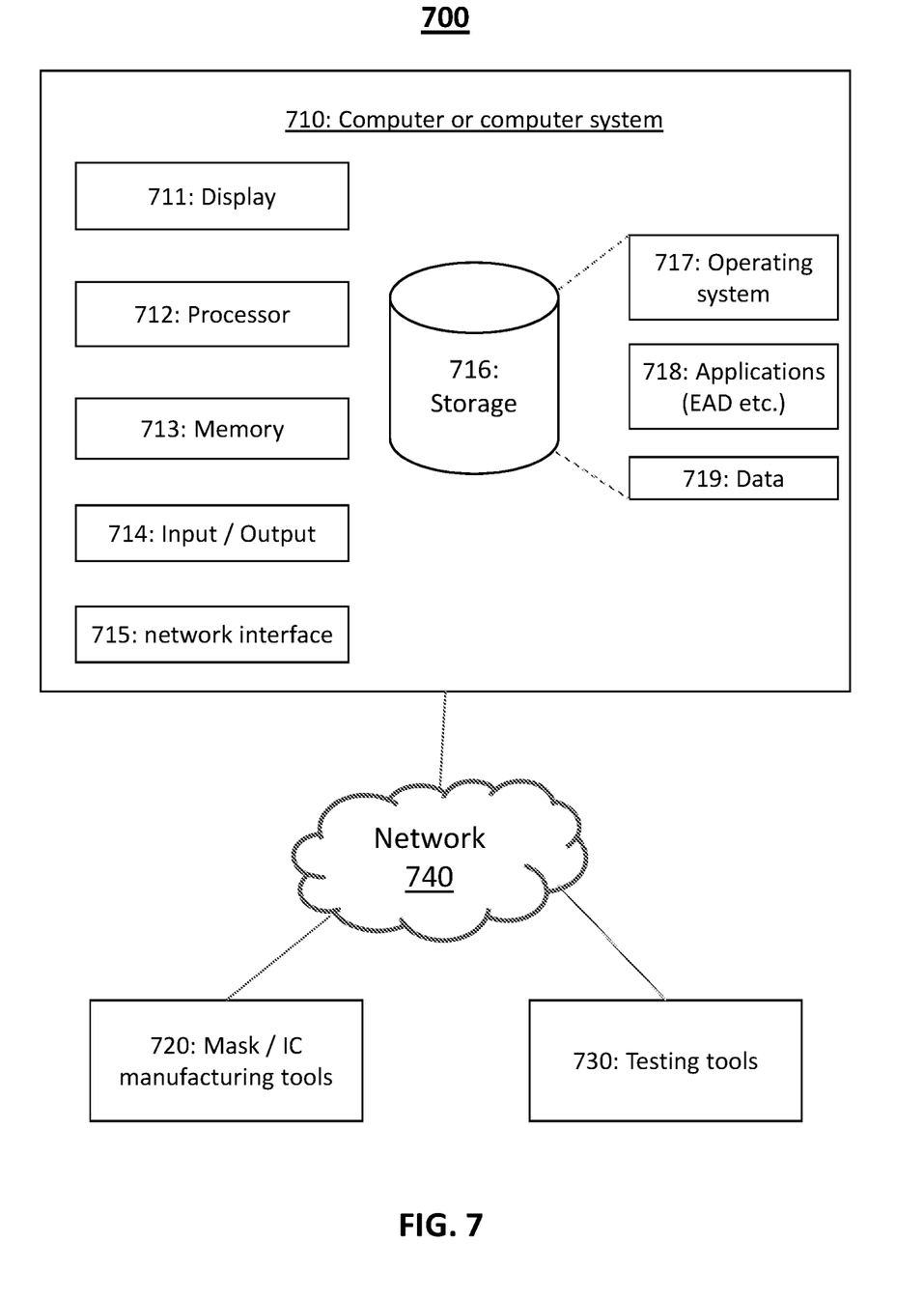
FIG. 7 illustrates a system for making an IC in accordance with some embodiments.

FIG. 7 illustrates a system for making an IC in accordance with some embodiments.

The system 700 includes a computer or a computer system 710, mask and IC manufacturing tools 720, testing tools 730, and a wireless or wired network 740 connecting the computer system 710, the mask and IC manufacturing tools 720, and the testing tools 730 to each other to allow data exchange therebetween.

The computer or the computer system 710 includes a display 711, a processor 712, a memory 713, an input/output interface 714, a network interface 715, and a storage 716 storing an operating system 717, programs or application 718 such as EDA, and data 719.

The applications 718 can include instructions which, when executed by the computer or the computer system 710 (or the processor 712 thereof), can cause the computer or the computer system 710 (or the processor 712 thereof) to perform operations, methods, and/or processes that are explicitly or implicitly described in the present disclosure.

The data 719 can include any default data including default parameters used in the modeling, any data that is received, for example, through user input via input/output interface or through the network interface 715 transmitted from the mask/IC manufacturing tools 720 and/or testing tools 730, any data that is to be displayed on the display 711, any data that is to be transmitted to or from the mask/IC manufacturing tools 720 and/or testing tools 730 via the network 740, or any interim data generated during computation by the computer or computer system 710.

The mask and IC manufacturing tools 720 includes but not limited to an e-beam writer or an e-beam lithography tool, a photolithography tool, etc., and the testing tools 730 include but not limited to a surface profile measurement tools such as a scanning electron scope.

According to some aspects, an OPC operation can be used to correct the long-rang effects. Thus, an MPC operation which may be used to correct the long-range effects in the mask making process can be omitted in correcting the long-range effects. Accordingly, by omitting the MPC operation, less computation is used to obtain the electron beam shot map for mask making and turnaround time to synthesize the mask pattern can be shortened, as compared to an example in which the long-range effects are corrected in the MPC rather than in the OPC.

According to some aspects, since the MPC operation is not used, additional errors which may be introduced in the MPC operation can be avoided, thereby improving modeling accuracy.

According to some aspects, the coarse-grid mask density map is used during model calibration and the coarse-grid correction map is used during the OPC, thereby reducing calculation time as compared to an example only fine-grid calculations are used.

In one embodiment, a method for mask data synthesis and mask making includes calibrating an optical proximity correction (OPC) model by adjusting a plurality of parameters including a first parameter and a second parameter, wherein the first parameter indicates a long-range effect caused by an electron-beam lithography tool for making a mask used to manufacture a structure, and the second parameter indicates a geometric feature of a structure or a manufacturing process to make the structure; generating a device layout; calculating a first grid pattern density map of the device layout; generating a long-range correction map, at least based on the calibrated OPC model and the first grid pattern density map of the device layout; and performing an OPC to generate a corrected mask layout, at least based on the generated long-range correction map and the calibrated OPC model. In one embodiment, the method further includes generating a fractured mask layout or an electron-beam shot map, at least based on the corrected mask layout. In one embodiment, the method further includes making, by the electron-beam lithography tool, a mask based on the fractured mask layout or the electron-beam shot map. In one embodiment, the method further includes selecting a first grid among a plurality of grids. A grid volume of the first grid is smaller than that of at least one of the plurality of grids, and the calculating the first grid pattern density map of the device layout is based on the first grid. In one embodiment, the calibrating the OPC model includes: forming a test mask with test structures based on a test layout different from the device layout; forming a patterned layer on a substrate by using the test mask in a lithography process; measuring a contour or a critical dimension (CD) of the patterned layer; generating a second grid pattern density map of the test layout; receiving a value of the first parameter indicative of the long-range effect, and a value of the second parameter indicative of the geometric feature of the structure or the manufacturing process; calculating a contour or CD of the patterned layer of the test layout; and iterating: adjusting the value of the first parameter indicative of the long-range effect and the value of the second parameter indicative of the geometric feature of the structure or the manufacturing process to first and second values, respectively, calculating a mask pattern shape using a mask model including the first and second values respectively indicative of the long-range effect and the geometric feature, and calculating a new calculated contour or a new calculated CD of the test layout at least based on the calculated mask pattern shape, until a difference between the new calculated contour or the new calculated CD of the test layout and the measured contour or the measured CD of the patterned layer is within a predetermined range. The calibrated OPC model includes the first parameter indicative of the long-range effect having a last adjusted value among the adjusted first values during the iteration and the second parameter indicative of the geometric feature of the structure or the manufacturing process among the adjusted second values during the iteration. In one embodiment, the method further includes selecting a second grid among a plurality of grids. A grid volume of the second grid is smaller than that of at least one of the plurality of grids, and the calculating the second grid pattern density map of the device layout is based on the second grid. In one embodiment, a computer device includes a non-transitory computer readable medium storing instructions that, when executed by a processor of the computer device, cause the processor to perform the above method.

In one embodiment, a method for mask data synthesis and mask making includes calibrating an optical proximity correction (OPC) model by adjusting a plurality of parameters including a first parameter and a second parameter, wherein the first parameter indicates a long-range effect caused by an electron-beam lithography tool for making a mask used to manufacture a structure, and the second parameter indicates a geometric feature of a structure or a manufacturing process to make the structure; generating a device layout; calculating a first grid pattern density map of the device layout; and performing an OPC to generate a corrected mask layout, at least based on the first grid pattern density map and the calibrated OPC model. In one embodiment, the method further includes generating a fractured mask layout or an electron-beam shot map, at least based on the corrected mask layout. In one embodiment, the method further includes making, by the electron-beam lithography tool, a mask based on the fractured mask layout or the electron-beam shot map. In one embodiment, the method further includes selecting a first grid among a plurality of grids. A grid volume of the first grid is smaller than that of at least one of the plurality of grids, and the calculating the first grid pattern density map of the device layout is based on the first grid. In one embodiment, the calibrating the OPC model includes: forming a test mask with test structures based on a test layout different from the device layout; forming a patterned layer on a substrate by using the test mask in a lithography process; measuring a contour or a critical dimension (CD) of the patterned layer; generating a second grid pattern density map of the test layout; receiving a value of the first parameter indicative of the long-range effect, and a value of the second parameter indicative of the geometric feature of the structure or the manufacturing process; calculating a contour or CD of the patterned layer of the test layout; and iterating: adjusting the value of the first parameter indicative of the long-range effect and the value of the second parameter indicative of the geometric feature of the structure or the manufacturing process to first and second values, respectively, calculating a mask pattern shape using a mask model including the first and second values respectively indicative of the long-range effect and the geometric feature, and calculating a new calculated contour or a new calculated CD of the test layout at least based on the calculated mask pattern shape, until a difference between the new calculated contour or the new calculated CD of the test layout and the measured contour or the measured CD of the patterned layer is within a predetermined range. The calibrated OPC model includes the first parameter indicative of the long-range effect having a last adjusted value among the adjusted first values during the iteration and the second parameter indicative of the geometric feature of the structure or the manufacturing process among the adjusted second values during the iteration. In one embodiment, the method further includes selecting a second grid among a plurality of grids. A grid volume of the second grid is smaller than that of at least one of the plurality of grids, and the calculating the second grid pattern density map of the device layout is based on the second grid. In one embodiment, a computer device includes a non-transitory computer readable medium storing instructions that, when executed by a processor of the computer device, cause the processor to perform the above method.

In one embodiment, a method for mask data synthesis and mask making includes retrieving a predetermined value of a first parameter indicating a long-range effect, wherein the long-range effect is an effect caused by an electron-beam lithography tool for making a mask; calibrating an optical proximity correction (OPC) model, at least based on the predetermined value of the first parameter indicating the long-range effect; generating a device layout; calculating a first grid pattern density map of the device layout; generating a long-range correction map, at least based on the first grid pattern density map of the device layout and the retrieved predetermined value of the first parameter indicating the long-range effect; and performing an OPC to generate a corrected mask layout, at least based on the generated long-range correction map and the calibrated OPC model. In one embodiment, the method further includes generating a fractured mask layout or an electron-beam shot map, at least based on the corrected mask layout; and making, by the electron-beam lithography tool, a mask based on the fractured mask layout or the electron-beam shot map. In one embodiment, the method further includes selecting a first grid among a plurality of grids. A grid volume of the first grid is smaller than that of at least one of the plurality of grids, and the calculating the first grid pattern density map of the device layout is based on the first grid. In one embodiment, the calibrating the OPC model includes forming a test mask with test structures based on a test layout different from the device layout; forming a patterned layer on a substrate by using the test mask in a lithography process; obtaining a contour or CD of the patterned layer by measuring the patterned layer; generating a second grid pattern density map of the test layout; receiving a value of a second parameter indicating a geometric feature of a structure or a manufacturing process to make a structure; calculating a contour or CD of the patterned layer of the test layout, at least based on the received predetermined value of the first parameter indicating the long-range effect and the value of the second parameter; and iterating: adjusting the value of the second parameter and calculating a new calculated contour or a new calculated CD of the test layout, until a difference between the calculated contour or the calculated CD of the test layout and the measured contour or the measured CD of the patterned layer is within a predetermined range. The calibrated OPC model includes the second parameter having a last adjusted value among the adjusted values during the iteration. In one embodiment, the method further includes selecting a second grid among a plurality of grids. A grid volume of the second grid is smaller than that of at least one of the plurality of grids, and the calculating the second grid pattern density map of the device layout is based on the second grid. In one embodiment, a computer device includes a non-transitory computer readable medium storing instructions that, when executed by a processor of the computer device, cause the processor to perform the above method.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for semiconductor manufacturing, comprising:
a processor;
wherein the processor is configured to:
calibrate an optical proximity correction (OPC) model by adjusting a plurality of parameters including a first parameter and a second parameter, wherein the first parameter corresponds to a long-range effect caused by an electron-beam lithography tool for making a mask used to manufacture a structure, and the second parameter corresponds to a geometric feature of a structure or a manufacturing process to make the structure;
calculate a first grid pattern density map of a device layout;
generate a long-range correction map, at least based on the calibrated OPC model and the first grid pattern density map of the device layout; and
perform an OPC to generate a corrected mask layout, at least based on the generated long-range correction map and the calibrated OPC model.

2. The system of claim 1, wherein the mask comprises a fractured mask layout.

3. The system of claim 1, wherein the mask comprises an electron-beam shot map.

4. The system of claim 1, wherein the first grid pattern density map is based on a first grid of a plurality of grids, wherein a grid volume of the first grid is smaller than grid volumes of other grids of the plurality of grids.

5. The system of claim 1, wherein, for calibrating the OPC model, the processor is further configured to:
form a test mask with test structures based on a test layout different from the device layout;
form a patterned layer on a substrate by using the test mask in a lithography process;
measure a contour or a critical dimension (CD) of the patterned layer;
generate a second grid pattern density map of the test layout;
receive a value of the first parameter indicative of the long-range effect, and a value of the second parameter indicative of the geometric feature of the structure or the manufacturing process;
measure a contour or CD of a patterned layer of the test layout; and
iterating: adjusting the value of the second parameter indicative of the geometric feature of the structure or the manufacturing process to a second value, calculating a mask pattern shape using a mask model including the second value indicative of the geometric feature, and calculating a new calculated contour or a new calculated CD of the test layout at least based on the calculated mask pattern shape, until a difference between the new calculated contour or the new calculated CD of the test layout and the measured contour or the measured CD of the patterned layer is within a predetermined range.

6. The system of claim 5, wherein the processor is further configured to:
select a second grid among a plurality of grids,
wherein a grid volume of the second grid is smaller than that of at least one of the plurality of grids, and wherein the second grid pattern density map of the device layout is based on the second grid.

7. The system of claim 1, wherein the long-range effect comprises a backscattering effect.

8. A system of semiconductor manufacturing, comprising:
a processor;
a testing tool coupled to the processor;
a mask manufacturing tool coupled to the processor; and
an IC manufacturing tool coupled to the processor;
wherein the processor is configured to:
calculate a first grid pattern density map associated with a device layout and a second grid pattern density map associated with the device layout, wherein a density of a first grid volume of the first grid pattern density map is larger than a density of a second grid volume of the second grid pattern density map;
calibrate an optical proximity correction (OPC) model by adjusting a plurality of parameters including a first set of parameters and a second set of parameters, wherein the first set of parameters indicate a long-range effect caused by an electron-beam lithography tool for making a mask used to manufacture a structure, and the second set of parameters indicate a geometric feature of a structure or a manufacturing process to make the structure, wherein the second grid pattern density map is used during the calibration;
perform an OPC to generate a corrected mask layout, at least based on the calibrated OPC model and using the first grid pattern density map;
control the IC manufacturing tool to use the corrected mask layout to expose a resist layer on a wafer to form a patterned resist layer;
determine whether a measured critical dimension (CD) of the patterned resist layer is within a predetermined range;
adjust the second set of parameters without modifying the first set of parameters if the determined measured CD is not within the predetermined range;
iteratively perform the calibrating the OPC model, the performing the OPC, and the adjusting the second set of parameters until the measured CD is within the predetermined range to generate a final corrected mask layout;
control the mask manufacturing tool to produce the final corrected mask layout as a mask; and
control the IC manufacturing tool to produce a photo resist pattern on a wafer.

9. The system of claim 8, wherein the mask comprises a fractured mask layout or an electron-beam shot map.

10. The system of claim 9, wherein the mask manufacturing tool is further configured to produce, by the electron-beam lithography tool, a mask based on the fractured mask layout or the electron-beam shot map.

11. The system of claim 8, wherein the processor is further configured to:
select a first grid among a plurality of grids,
wherein a grid volume of the first grid is smaller than that of at least one of the plurality of grids, and wherein the first grid pattern density map of the device layout is based on the first grid.

12. The system of claim 8, wherein, for calibrating the OPC model, the processor is further configured to:

form a test mask with test structures based on a test layout different from the device layout;
form a patterned layer on a substrate by using the test mask in a lithography process;
control the testing tool to measure a contour or a critical dimension (CD) of the patterned layer;
generate a second grid pattern density map of the test layout;
receive first values of the first set of parameters indicative of the long-range effect, and values of the second set of parameters indicative of the geometric feature of the structure or the manufacturing process;
control the testing tool to measure a contour or CD of the patterned layer of the test layout; and
iterating: adjusting the values of the second set of parameters indicative of the geometric feature of the structure or the manufacturing process to second values, control the testing tool to measure a mask pattern shape using a mask model including the first values and the second values respectively indicative of the long-range effect and the geometric feature, and controlling the testing tool to measure a new calculated contour or a new calculated CD of the test layout at least based on the calculated mask pattern shape, until a difference between the new calculated contour or the new calculated CD of the test layout and the measured contour or the measured CD of the patterned layer is within a predetermined range,
wherein the calibrated OPC model includes the received first values of the first set of parameters indicative of the long-range effect and the last adjusted second values of the second set of parameters indicative of the geometric feature of the structure or the manufacturing process among the adjusted second values during the iteration.

13. The system of claim 12, wherein the processor is further configured to:
select a second grid among a plurality of grids,
wherein a grid volume of the second grid is smaller than that of at least one of the plurality of grids, and wherein the second grid pattern density map of the device layout is based on the second grid.

14. The system of claim 8, wherein the long-range effect comprises a resist develop loading effect.

15. A system of semiconductor manufacturing, comprising:
a processor;
a non-transitory memory device coupled to the processor;
a testing tool coupled to the processor;
a mask manufacturing tool coupled to the processor; and
an IC manufacturing tool coupled to the processor;
wherein the processor is configured to execute instructions stored on the non-transitory memory device to:
select one or more regions of a device layout;
calibrate an optical proximity correction (OPC) model by adjusting a plurality of parameters including a first set of parameters and a second set of parameters, wherein the first set of parameters indicate a long-range effect caused by an electron-beam lithography tool for making a mask used to manufacture a structure, and the second set of parameters indicate a geometric feature of a structure or a manufacturing process to make the structure, wherein the first set of parameters are constants;
calculate a first grid pattern density map of the one or more regions of the device layout;
generate a long-range correction map of the one or more regions, at least based on the calibrated OPC model and the first grid pattern density map of the device layout; and
perform an OPC to generate a corrected mask layout at the one or more regions, at least based on the generated long-range correction map and the calibrated OPC model;
control the IC manufacturing tool to expose a resist layer on a wafer using the corrected mask layout to form a patterned resist layer;
determine whether a measured critical dimension (CD) of the patterned resist layer at the one or more regions is within a predetermined range;
adjust a single parameter of the second set of parameters without modifying other parameters of the second set of parameters if the determined measured CD is not within the predetermined range; and
iteratively perform the calibrating the OPC model, the generating the long-range correction map, the performing the OPC, and the adjusting the second set of parameters until the measured CD is within the predetermined range to generate a final corrected mask layout, wherein in each iteration one parameter of the second set of parameters is adjusted; and
control the mask manufacturing tool to produce the final corrected mask layout as a mask.

16. The system of claim 15, wherein the processor is further configured to:
generate a fractured mask layout or an electron-beam shot map, at least based on the corrected mask layout; and
produce, by the electron-beam lithography tool, a mask based on the fractured mask layout or the electron-beam shot map.

17. The system of claim 15, wherein the processor is further configured to:
select a first grid among a plurality of grids,
wherein a grid volume of the first grid is smaller than that of other grids of the plurality of grids, and wherein the first grid pattern density map of the device layout is based on the first grid.

18. The system of claim 15, wherein the long-range effect comprises a fogging effect.

19. The system of claim 17, wherein the processor is further configured to:
select a second grid among the plurality of grids, wherein a grid volume of the second grid is smaller than that of at least one of the plurality of grids; and
generate a second grid pattern density map of the device layout based on the second grid.

20. The system of claim 15, wherein the processor is further configured to: control the IC manufacturing tool to generate a device layout on the patterned resist layer the wafer.

* * * * *